United States Patent [19]

Possin et al.

[11] Patent Number: 5,430,298

[45] Date of Patent: Jul. 4, 1995

[54] CT ARRAY WITH IMPROVED PHOTOSENSOR LINEARITY AND REDUCED CROSSTALK

[75] Inventors: George E. Possin; Ching-Yeu Wei, both of Schenectady, N.Y.

[73] Assignee: General Electric Company, Schenectady, N.Y.

[21] Appl. No.: 264,098

[22] Filed: Jun. 21, 1994

[51] Int. Cl.$^6$ .............................. G01T 1/20
[52] U.S. Cl. .............. 250/370.11; 250/366; 250/368; 250/370.09
[58] Field of Search ............... 250/370.11, 368, 366, 250/367, 370.09

[56] References Cited

U.S. PATENT DOCUMENTS

| | | | |
|---|---|---|---|
| 4,720,426 | 1/1988 | Englert et al. | 428/344 |
| 4,914,301 | 4/1990 | Akai | 250/370.11 |
| 4,982,096 | 1/1991 | Fujii et al. | 250/370.11 |
| 5,179,284 | 1/1993 | Kingsley et al. | 250/370.11 |
| 5,233,181 | 8/1993 | Kwasnick et al. | 250/208.1 |

*Primary Examiner*—Carolyn E. Fields
*Attorney, Agent, or Firm*—Donald S. Ingraham; Marvin Snyder

[57] ABSTRACT

A computed tomography (CT) imager includes a scintillator and a photosensor array optically coupled to the scintillator through an optical coupling layer. The photosensor array includes a plurality of photosensitive devices disposed in a block so as to receive incident light from the scintillator through a first surface of the block; each photosensitive device forms a pixel in the array, and each pixel further has a fully photoactive region in which the quantum efficiency of the photosensor is greater than about 65%. The optical coupling layer further includes a pixel boundary light barrier that is made of light absorptive material disposed in the optical coupling layer overlying the areas on the photosensor array first surface between respective fully photoactive regions of the photosensitive devices. The pixel boundary light barrier is disposed to absorb substantially all light photons passing along a path between the scintillator and pixels in the photosensor array other than the pixel underlying the portion of the scintillator in which the light photons were generated, thereby reducing noise and cross-talk in the array and enhancing the linear operating characteristics of photosensors in the array.

21 Claims, 2 Drawing Sheets

CT ARRAY WITH IMPROVED PHOTOSENSOR LINEARITY AND REDUCED CROSSTALK

RELATED APPLICATIONS AND PATENTS

This application is related to the application entitled "Solid State Imager with Opaque Layer", Ser. No. 08/264,097, filed concurrently herewith and assigned to the assignee of the present invention.

BACKGROUND OF THE INVENTION

Computed tomography (CT)imaging arrays typically comprise large arrays of photosensor devices coupled through an optical coupling layer to a scintillator in which the incident radiation (such as x-rays) to be detected by the imager is absorbed. Light photons generated in the scintillator as a result of the absorption of incident radiation pass to the photodetector array and are in turn absorbed by the photosensor, resulting in the accumulation of charge on the photosensor that corresponds to the flux of light photons; reading the charge accumulated on respective photosensors provides a measure of the intensity of the incident x-rays and the relative position on the array at which the x-ray radiation was absorbed.

In conventional CT arrays, photosensors are arranged in a one-dimensional array with each photosensor being directly coupled to readout electronics (in a one-dimensional array, the photosensor are aligned in a pattern along one axis). In volumetric CT devices the photosensor arrays typically comprise photosensor array blocks in which photodiodes are arranged in a two-dimensional pixel array (that is, disposed in a pattern along two axes). These photosensor arrays typically comprise a block of semiconductive material in which respective contact pads are formed along one surface of the array block and an electrode is disposed along an opposite surface of the array block. The respective photosensors in the block correspond to each contact pad; a bias voltage is applied by the back electrode to the respective photosensors in the array and results in a depletion region being formed in the semiconductive material surrounding the contact pads. Charge generated in the photodiode as a result of the absorption of light photons from the scintillator is collected at respective pixel contact pads and processed by the readout electronics to generate the imager output signal.

It is desirable that the photosensor array in a CT imager array exhibit low noise, low cross-talk between photodiodes, and a high degree of linearity (that is, respective photosensors developing corresponding amounts of charge in response to the same intensity of incident radiation on the imager). For example, to minimize cross-talk between photodiodes, reflective or light absorptive material is disposed around portions of the scintillator overlying respective pixels in order to reduce scattering of light photons within the scintillator to pixels other than the pixel underlying the portion of the scintillator in which the light photons were formed in response to the absorption of the incident radiation.

In addition, as new two-dimensional arrays are developed for use in volumetric C T, it is thought that the light-transmissive optical coupling layer in convention CT type imager arrays will present a problem with respect to cross-talk and linearity of the respective photodiodes. Optical photons generated in one portion of the scintillator overlying a particular pixel can be scattered and pass through the optical coupling layer into an adjoining pixel; this passage presents problems of increased cross-talk in the array, that is, detection in photodiodes of light absorbed in portions of the scintillator other than that portion of the scintillator overlying the pixel, which reduces the spatial resolution of the array.

Further, the absorption of photons in the region between the diodes can affect the linearity of the array as the amount of charge collected on a particular diode is a function of the voltage across the diode (the bias voltage across the diode affects the extent of the depletion region surrounding the contact pad and hence the sensitive, or photoactive, region of a given photodiode). Thus, the size of depletion region of a given photodiode is affected by signal strength as the greater the number of incident optical photons the greater the amount of charge collected, and thus the greater the reduction in the size of the depletion region. Charge not collected by one photodiode in which the depletion region has become smaller due to reduced bias voltage may be lost through recombination; this loss results in non-linearity in the array. Such absorption of photons in the region between the diodes can result from: the scintillator being larger than the underlying diodes; optical photons leaving the scintillator at an angle such as to hit the region between the diodes; and, scattering of optical photons in the optical coupling layer between the scintillator and the photosensor array.

It is thus an object of this invention to provide a CT photosensor array having low cross-talk and high linearity of photosensor devices in the array.

It is a further object of this invention to provide a low noise photosensor array,

SUMMARY OF THE INVENTION

In accordance with this invention a computed tomography (CT) imager includes a scintillator and a photosensor array optically coupled to the scintillator through an optical coupling layer. The photosensor array comprises a block having a plurality of photosensitive devices disposed to receive incident light from the scintillator through a first surface of the block; each photosensitive device comprises a pixel in the array, and each pixel further comprises a fully photoactive region in which the internal quantum efficiency of the photosensor is greater than about 65%. The optical coupling layer further comprises a pixel boundary light barrier which in turn comprises light absorptive material disposed overlying the areas on the photosensor array first surface between respective fully photoactive regions of the photosensitive devices. The pixel boundary light barrier is disposed to absorb substantially all light photons passing along a path between the scintillator and pixels in the photosensor array other than the pixel underlying the portion of the scintillator in which the light photons were generated.

The pixel boundary light barrier typically comprises a thermally stable polymer mixed with a light absorptive material such as an organic dye, carbon, or graphite, such that the absorbance of the light barrier is not less than 1 and typically is 2 or greater. The width of respective segments of pixel boundary light barrier between pixels typically corresponds to the potentially non-fully photoactive gap between pixels. The dimensions of the potentially non fully-photoactive gap correspond to the distance between the lateral extent of the depletion regions of adjoining photodiodes. The gap corresponds to at least the distance between the lateral extent of the full bias depletion regions of adjoining of each of the respective adjoining pixels; and typically corresponds to the distance between the lateral extent of the zero bias depletion region of the photodiode. In one embodiment, the light barrier covers the array block surface between respective contact pads of adjoining pixels. The light barrier layer is also typically disposed on the photosensor array first surface over the switching components coupled to the photosensors in the array. At least one channel is typically disposed through a portion of the pixel boundary light barrier layer surrounding each pixel in the array.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1:
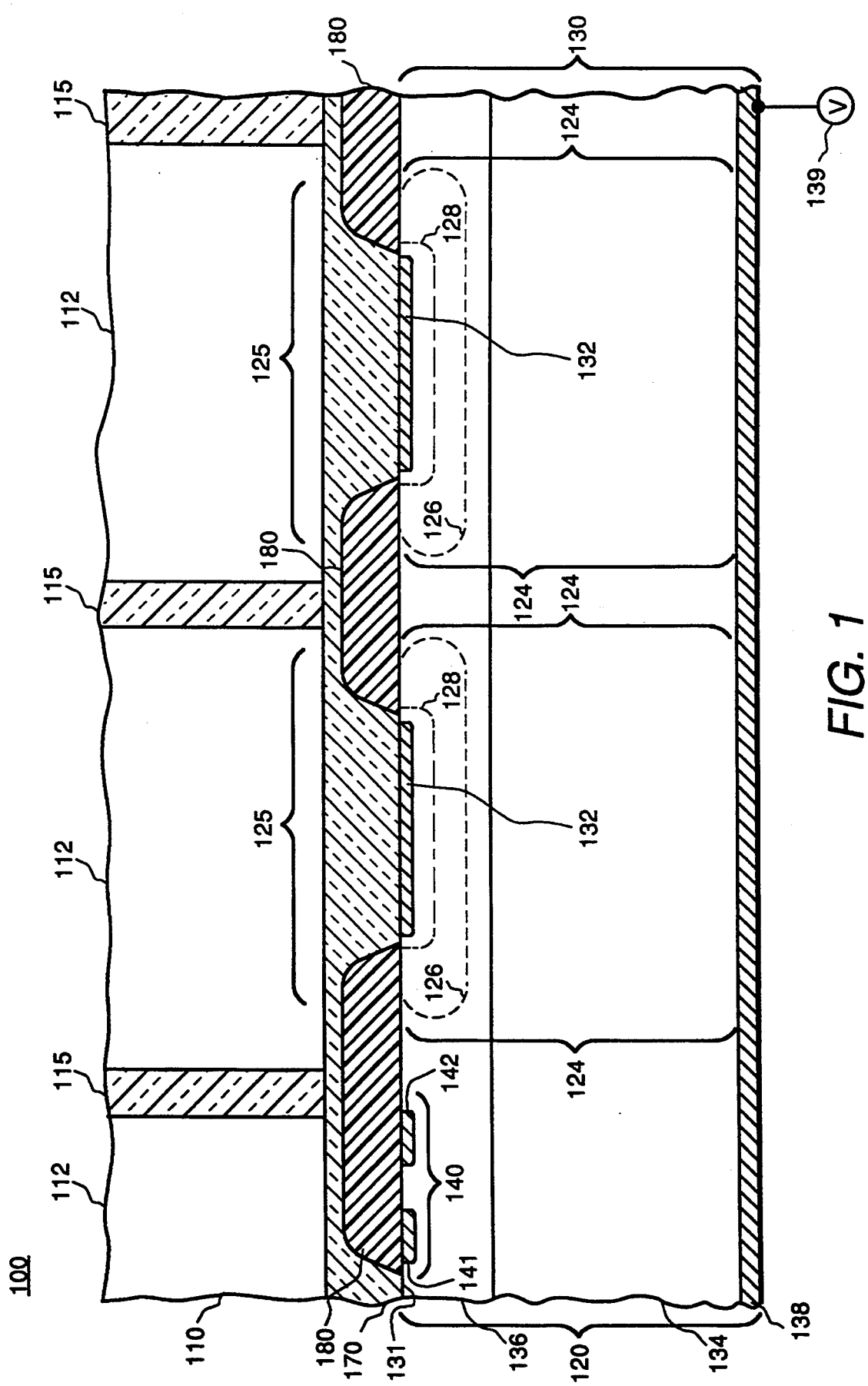
FIG. 1 is a cross-sectional view of a portion of a photosensor array having a pixel boundary light barrier in accordance with this invention.

A computed tomography (CT) radiation imager 100 comprises a scintillator 110 that is optically coupled to a photosensor array 120 via an optical coupling layer 170 as illustrated in FIG. 1. In accordance with this invention, optical coupling layer 170 comprises a pixel boundary light barrier 180 disposed over portions of photosensor array 120.

Scintillator 110 comprises a scintillating material selected to have a high absorption cross section for radiation of the type it is desired to detect with imager 100; for example, in CT imagers designed for detection of x-rays, a scintillator material such as LUMEX ™, available from the General Electric Co., is commonly used typically. Absorption of the incident radiation in the scintillator material results in generation of optical photons, some number of which pass into photosensor array 120 via optical coupling layer 170. Scintillator 110 typically comprises a plurality of scintillator elements 112 that are separated from adjoining elements by partitions 115. Partitions typically comprise an opaque reflective material such as aluminum, silver, gold, or the like, or alternatively, plastic or epoxy materials mixed with scattering (or absorbing) materials such as titanium oxide ($TiO_2$) particles, so as to limit the passage of optical photons generated in one scintillator element 112 into an adjoining scintillator element 112.

Photosensor array comprises an array block 130 having a plurality of photosensor devices 124 disposed therein; each photosensor device 124 comprises a respective pixel 125 in the array. Array block 130 has a first surface 131 on which optical coupling layer 170 is disposed and through which optical photons from scintillator elements 112 enter respective photosensors 124. As illustrated in FIG. 1, each photosensor in block 130 is a photodiode that comprises a respective contact pad 132 disposed in block 130 along first surface 131. Each contact pad 132 comprises p+-type doped single crystal silicon (that is, silicon doped to have a concentration of p type dopant having an order of magnitude in the range between about $10^{16}$ and $10^{20}$). Doping of contact pads 132 is typically accomplished in an ion implant process from first surface 131. The thickness of contact pads 132 is typically in the range between about 0.1 µm and 2 µm.

Block 130 further comprises a first semiconductor material layer 134 comprising n+-type single crystal silicon (that is, silicon doped to have a n-type dopant concentration having an order of magnitude between about $10^{16}$ and $10^{20}$); the thickness of first semiconductor material layer 134 is typically in the range between about 100 µm and 500 µm. An epitaxial semiconductor layer 136 is disposed over first semiconductor material layer 134; layer 136 typically comprises n type single crystal silicon (that is, silicon doped to have an n type dopant concentration order of magnitude in the range between about $10^{12}$ and $10^{15}$); the thickness of epitaxial layer 136 is typically in the range between about 5 µm and 100 µm. An electrically conductive back contact layer 138 is disposed along the surface of block 130 opposite first surface 131 and is coupled to a voltage source 139. Voltage source 139 is selected to apply a desired biasing voltage to respective photodiodes 124 in photosensor array 120; typically voltage source applies a voltage in the range between about 1 volt and 20 volts so as to reverse bias each photodiode 124 in the array. Alternatively, the photosensor array can be fabricated with the doping types reversed from that discussed above, that is block 130 comprises p-type silicon and respective contact pads 132 comprise n+-type silicon.

In one alternative embodiment (not illustrated) photosensor array block 130 comprises a single bulk layer of n type silicon in which the respective p+-type silicon contact pads 132 are disposed. A back contact layer is disposed in contact with the bulk layer of n type silicon so as to apply the desired biasing voltage.

When a biasing voltage is applied to photosensor 124, each pixel 125 further has a photoactive area, that is, an area in which the absorption of incident light photons results in the generation of charge that is collected at contact pad 132. Not all charge generated in the photodiode is collected at the diode's respective contact pad 132; some of the charge is lost by recombination, and some of the charge migrates into adjoining photodiodes (adjoining referring to photodiodes disposed next to one another in the photosensor array). A measure of the effectiveness of the charge collection process is the quantum efficiency of the photodiode. Quantum efficiency is defined as the ratio of the number of electronic charges collected by a diode to the number of photons incident on the diode's surface; external quantum efficiency refers to the photon flux incident on the optical coupling surface of the photodiode, whereas internal quantum efficiency refers to the photon flux that enters the semiconductor region of the photodiode. Each photodiode 124 further comprises a fully photoactive region; as used herein, the term "fully photoactive" or the like refers to a photoactive region of the photodiode having an internal quantum efficiency not less than about 65%.

The extent of the fully photoactive area of the photodiode corresponds to the depletion region in the n type silicon surrounding the contact pad; when the diode is fully reversed biased (e.g., substantially the full reverse bias voltage is applied across the diode and essentially no charge has been collected at the respective contact pad 132) a full-bias depletion region exists, as defined by the full bias depletion region boundary 126 illustrated in FIG. 1. After charge has been collected on photodiode 124 (with the diode not coupled to readout electronics), the amount of reverse bias across the diode drops. At the highest possible signal level that the diode can read, the diode reaches a zero-bias (or alternatively, a slight (e.g., 0.1 volts) forward bias condition); in this situation, the extent of the zero bias depletion region is illustrated by the zero-bias depletion region boundary 128 as illustrated in FIG. 1. The respective zero-bias and full-bias depletion regions correspond to the fully photoactive regions of the photodiode in those respective bias conditions, that is, as the reverse bias on the photodiode decreases, the extent of the fully photoactive region also decreases. In the non-fully photoactive region of the array, that is the region of the array outside of the respective fully photoactive areas of the photodiodes, the quantum efficiency of the device falls off in substantially an exponential manner, with the fall-off slope of a particular device being a function of the particular device and the processes used to fabricate it.

Pixel boundary light barrier layer 180 comprises a light absorptive material having an absorbance value of at least 1 and typically 2 or greater. Absorbance, as used herein, is a measure of the light absorption characteristics of the material, and is determined by the negative log (base 10) of the transmittance (that is, the fraction of light getting through a sample). The light absorptive material typically comprises a polymer in which an organic dye such as Sudan Black B has been mixed, or alternatively, a substance such as carbon black, graphite, or the like, has been mixed to provide the desired absorbance value. Any polymer compatible with photosensor array 120 can be used, and illustrative examples include polyamides, polyimides, polycarbonates, polyesters, polyphenylene ethers, acrylics, and blends prepared therefrom. Pixel boundary light barrier 180 further is thermally stable, that is, the absorbance of the layer does not become less than 1 when heated for about six hours up to a temperature of about 250° C. Further, under the heating conditions noted above the polymer structure does not undergo chemical decomposition that would cause cracks or lifting of the layer resulting in the layer losing its dielectric properties or breaking the structural integrity of the layer (thereby exposing such underlying components in the array to materials used in other processing steps in the fabrication of the array).

Light barrier 180 is typically formed by spinning the polyimide/dye mixture on first surface 131 of photosensor array to a thickness in the range between about 1 and 100 μm (and usually about 5 μm), curing the polyimide/dye mixture (usually by baking at temperatures between about 200° C. and 400° C.), and then patterning the cured polyimide/dye material to form light barrier layer 180. Alternatively, light barrier layer 180 comprises an inorganic, or alternatively an organic, dielectric layer having metal particles (e.g., cermets) mixed therein to provide the desired absorbance values; such a layer typically is sputter-deposited over an insulating dielectric material.

Figure 2:
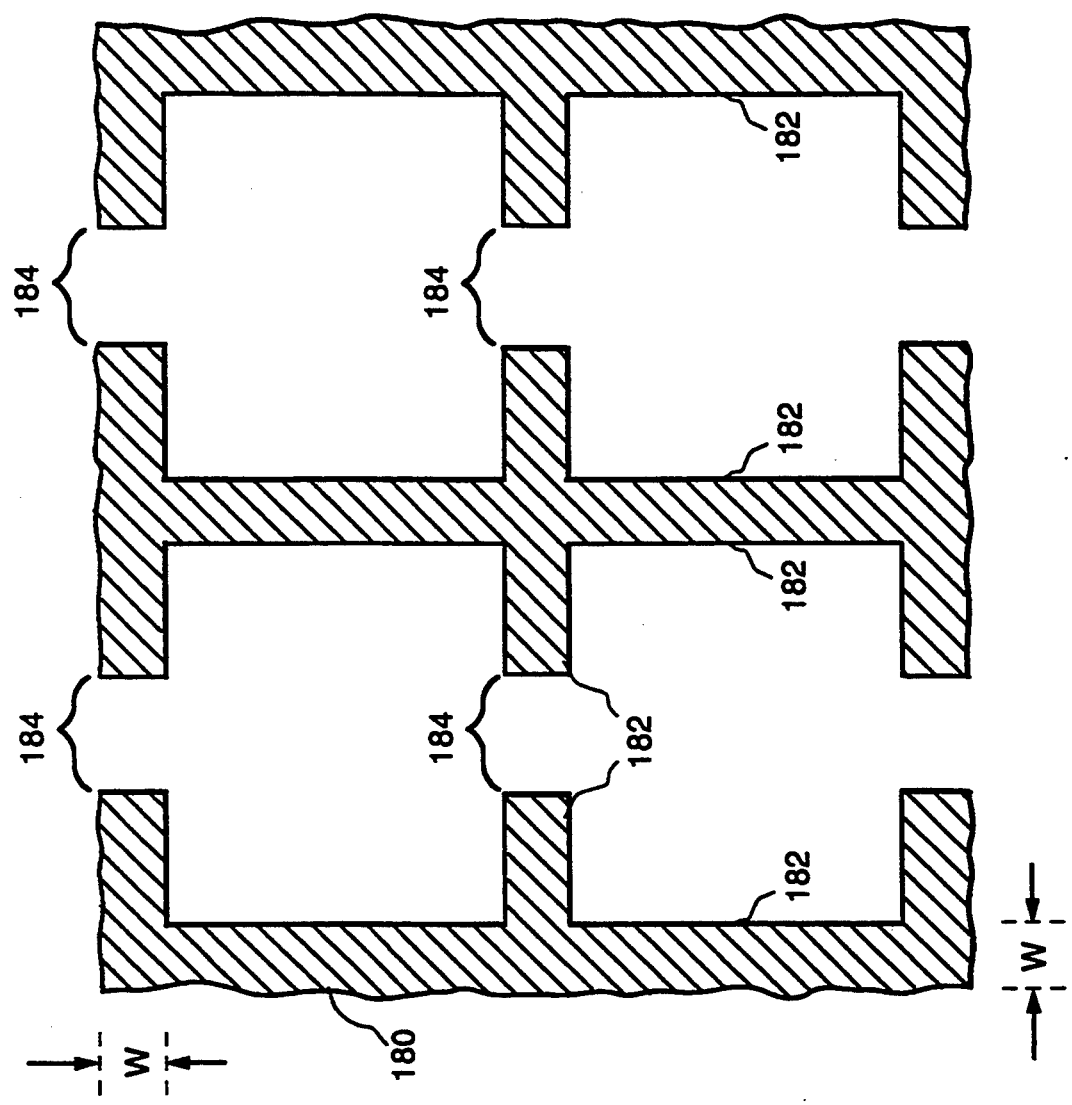
FIG. 2 is a plan view of a portion of a photosensor array having a pixel boundary light barrier in accordance with this invention.

In accordance with this invention, pixel boundary light barrier 180 is disposed on first surface 131 of photosensor block 130 so as to overlie the region of photosensor array 120 between respective fully photoactive regions of adjoining pixels 125. As is illustrated in FIG. 2, pixel boundary light barrier 180 comprises plurality of segments 182 that bound the area of respective pixels 125. Each segment 182 overlies non-fully photoactive regions between adjoining pixels 125, and the width "W" of a given segment 182 disposed between adjoining pixels 125 corresponds to (that is, of a length substantially the same as) the potentially non-fully photoactive gap between pixels. The potentially non-fully photoactive gap is the distance between the lateral extent of the depletion regions of adjoining photodiodes. The gap corresponds to at least the distance between the lateral extent of the full bias depletion regions of adjoining of each of the respective adjoining pixels; and typically corresponds to the distance between the lateral extent of the zero bias depletion region of the photodiode. As used herein, "lateral extent" refers to furthermost extension of the depletion region within the body of the diode, not just the extent of the depletion region along first surface 131 (the depletion region typically extends farther from the center of the diode farther in the body of the diode than at the surface). Alternatively, the width of the respective segments of pixel boundary light barrier 180 correspond to the distance between respective contact pads 132 (FIG. 1) disposed along first surface 131 of the photosensor array 120. The width W of segments 182 is thus selected to improve array linearity and reduced cross talk by providing desired light absorption of optical photons passing along a path (e.g., though multiple reflections (scattering)in the optical coupling layer) from one scintillator element 112 to the photodiode underlying another scintillator element 112.

In accordance with this invention, in a two-dimensional VCT photosensor array each contact pad 132 is typically coupled via a common electrode (not shown) and a switching device 140 such as a field effect transistor (FET) or the like to an address line coupled to readout electronics (not shown) so that the charge accumulated on the photodiode during an integration cycle of exposure to incident radiation can be read. Pixel boundary light barrier 180 is also typically disposed over switching elements 140 in photosensor array. A representative FET switch 140 having a p+-type source electrode 141 and a p+-type drain electrode 142 is illustrated in FIG. 1 (shown without address lines and photosensor contact lines coupled thereto). Because the semiconductor materials comprising FET 140 is similar to those used in photodiodes 124, light incident on FETs 140 can similarly result in charge generation which is the source of noise in the readouts from the photosensor array.

Pixel boundary light barrier 180 is disposed in optical coupling layer, that is, it is disposed on first surface 131 of photosensor array 120 and is otherwise surrounded by optical coupling layer 170, which typically comprises a light transmissive material such as a thermally stable polymer, an epoxy, or the like. The material comprising optical coupling layer is optimally selected to have an optical index of refraction that is between the respective indices of refraction of scintillator elements 112 and photodiodes 124 so as to provide an effective optical coupling layer therebetween.

Optical coupling layer 170 and pixel boundary light barrier 180 are typically formed in the following manner. Light barrier is first formed, for example by spinning the polyimide/dye mixture on over first surface 131; after curing, the opaque polyimide/dye material is patterned using photolithographic processes (that can provide high resolution (e.g., <5 μm) resolution) to provide the desired dimensions of segments 182 (FIG. 2) so as to have the light barrier disposed on first surface 131 overlying the areas between the fully photoactive regions of adjoining photodiodes and over switching elements.

In one embodiment of the invention, a channel 184 is disposed in at least one of the segments 182 surrounding each pixel 125 so as to allow fluid communication between the first surface areas overlying the fully photoactive regions of adjoining pixels 125. Optical coupling layer 170 is then deposited, such as UV light curable epoxy. The uncured epoxy is in a fluid state and thus extends over pixels 125 and around light barrier 180; channels 184 assist in the equal distribution of the liquid polyimide between pixels 125 and thus the formation of an optical coupling layer that covers light barrier 180 and is substantially planar. After the optically transparent epoxy is cured using UV illumination, scintillator 110 is formed thereover.

In operation, the presence of pixel boundary light barrier layer 180 serves to substantially prevent the scattering of optical photons generated in one scintillator element 112 into a photodiode other than the photodiode underlying that scintillator element in photosensor array 120, thereby reducing noise, cross-talk, and enhancing the linear operating characteristics of the individual photosensors 124 in array 120.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A computed tomography (CT) radiation imager comprising:
    a scintillator;
    a photosensor array optically coupled to said scintillator, said photosensor array comprising a block having a plurality of photosensitive devices disposed to receive incident light from said scintillator through a first surface of said block, each of said photosensitive devices comprising a pixel in said array, each of said pixels further comprising a respective fully photoactive region; and
    an optical coupling layer disposed between said scintillator and said photosensor array, said optical coupling layer further comprising a pixel boundary light barrier comprising a light absorptive material disposed in said optical coupling layer overlying the area on said photosensor array first surface between respective fully photoactive regions of adjoining ones of said photosensitive devices;
    whereby said pixel boundary light barrier is disposed so as to absorb light photons passing along a path between said scintillator and pixels in said photosensor array other than the pixel underlying the portion of the scintillator in which the light photons were generated.

2. The imager of claim 1 wherein the internal quantum efficiency of said respective fully photoactive regions is greater than about 65%.

3. The imager of claim 1 wherein said photosensor array block comprises a semiconductor material having a plurality of contact pads disposed along said first surface, each of said contact pads corresponding to a respective photosensitive device, said respective photosensitive devices being disposed in said block adjoining at least one other photosensitive device and wherein each of said fully photoactive region comprises the respective photosensor contact pad and a full-bias depletion region in said semiconductor material surrounding said contact pad.

4. The imager of claim 3 wherein each of said photosensitive devices further comprises a zero-bias depletion region.

5. The imager of claim 4 wherein said pixel boundary barrier layer comprises a plurality of segments disposed around respective pixels in said photosensor array, the width of each of said segments extends across at least a gap between the respective zero bias depletion regions of adjoining photosensitive devices.

6. The imager of claim 4 wherein said pixel boundary barrier layer comprises a plurality of segments disposed around respective pixels in said photosensor array, the width of said segments corresponding to the distance along said first surface between respective contact pads of adjoining photosensitive devices.

7. The imager of claim 4 wherein said pixel boundary layer further extends over switching elements in said photosensor array.

8. The imager of claim 1 wherein said pixel boundary light barrier comprises a thermally stable polymer and a light absorbing material.

9. The imager of claim 8 wherein said thermally stable polymer comprises a polymer selected from the group consisting of polyamides, polyimides, polycarbonates, polyesters, polyphenylene ethers, acrylics, and blends prepared therefrom.

10. The imager of claim 9 wherein said light absorbing material is selected from the group consisting of organic dyes, carbon black, and graphite.

11. The imager of claim 10 wherein said pixel boundary light barrier has an absorbance greater than 1.

12. The imager of claim 11 wherein the absorbance of said pixel boundary light barrier is not less than 2.

13. The imager of claim 8 wherein the thickness of said optical coupling layer is in the range between about 1 and 200 μm.

14. The imager of claim 10 wherein the thickness of said pixel boundary light barrier is in the range between about 1 μm and 100 μm.

15. The imager of claim 1 wherein said pixel boundary light barrier is further disposed on said photosensor array first surface so as to overlie switching components coupled to said photosensitive devices in said array.

16. The imager of claim 15 wherein said switching devices comprise field effect transistors (FETs).

17. The imager of claim 1 wherein said pixel boundary light barrier further comprises channels therein such that at least one channel is disposed through at least one segment of said pixel boundary light barrier disposed around each respective pixel in said photosensor array.

18. The imager of claim 3 wherein said photosensor array block comprises a first layer comprising n+type silicon and an epitaxial layer comprising n type silicon, each of the pixel contact pads being disposed in said epitaxial layer.

19. The imager of claim 1 wherein said pixel boundary light barrier comprises metal material disposed in a dielectric material layer.

20. The imager of claim 1 wherein said photosensitive devices in photosensor array are disposed in a one-dimensional pattern.

21. The imager of claim 1 wherein said photosensitive devices in photosensor array are disposed in a two-dimensional pattern.

* * * * *